United States Patent
Fernandes et al.

(10) Patent No.: US 11,569,342 B2
(45) Date of Patent: Jan. 31, 2023

(54) PRECISION CAPACITOR

(71) Applicant: TEXAS INSTRUMENTS INCORPORATED, Dallas, TX (US)

(72) Inventors: Poornika Fernandes, Murphy, TX (US); Luigi Colombo, Dallas, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 90 days.

(21) Appl. No.: 16/820,549

(22) Filed: Mar. 16, 2020

(65) Prior Publication Data

US 2020/0219969 A1 Jul. 9, 2020

Related U.S. Application Data

(62) Division of application No. 15/902,829, filed on Feb. 22, 2018.

(51) Int. Cl.
| | | |
|---|---|---|
| *H01L 49/02* | (2006.01) | |
| *C23C 16/455* | (2006.01) | |
| *H01L 21/677* | (2006.01) | |
| *H01G 4/018* | (2006.01) | |
| *H03M 1/12* | (2006.01) | |

(52) U.S. Cl.
CPC ............ *H01L 28/56* (2013.01); *C23C 16/455* (2013.01); *H01G 4/018* (2013.01); *H01L 21/67739* (2013.01); *H03M 1/12* (2013.01)

(58) Field of Classification Search
USPC ................................................. 257/532, 438
IPC .............. C23C 16/345,16/505, 16/455, 16/402, 16/0227; H01L 21/67739, 28/56; H01G 4/085, 4/33, 4/1272, 4/40, 4/018; H03M 1/12
See application file for complete search history.

(56) References Cited

U.S. PATENT DOCUMENTS

| | | | |
|---|---|---|---|
| 4,344,223 A | 8/1982 | Bulger et al. | |
| 6,794,700 B1 | 9/2004 | Beach et al. | |
| 2007/0152295 A1 | 7/2007 | Yeh et al. | |
| 2010/0096631 A1* | 4/2010 | Miyairi | H01L 27/1214 257/E21.414 |
| 2015/0187598 A1* | 7/2015 | Campbell | H01L 21/28518 438/396 |
| 2016/0104762 A1 | 4/2016 | Triyoso et al. | |

* cited by examiner

*Primary Examiner* — Hrayr A Sayadian
(74) *Attorney, Agent, or Firm* — Jacqueline J. Garner; Frank D. Cimino

(57) ABSTRACT

In a described example, a method for forming a capacitor includes: forming a capacitor first plate over a non-conductive substrate; flowing ammonia and nitrogen gas into a plasma enhanced chemical vapor deposition (PECVD) chamber containing the non-conductive substrate; stabilizing a pressure and a temperature in the PECVD chamber; turning on radio frequency high frequency (RF-HF) power to the PECVD chamber; pretreating the capacitor first plate for at least 60 seconds; depositing a capacitor dielectric on the capacitor first plate; and depositing a capacitor second plate on the capacitor dielectric.

12 Claims, 2 Drawing Sheets

PRECISION CAPACITOR

CROSS-REFERENCE TO RELATED APPLICATIONS

This application is a divisional of and claims priority to Ser. No. 15/902,829 filed Feb. 22, 2018. In addition, this application is related to U.S. patent application Ser. No. 15/902,764 that was also filed Feb. 22, 2018. The entire contents of both are incorporated by reference.

TECHNICAL FIELD

This disclosure relates generally to integrated circuits, and more particularly to integrated circuits with high precision capacitors.

BACKGROUND

A capacitor is an electrical device found in integrated circuits that is used to store and to measure electrical charge. Precision capacitors are used convert analog signals to digital voltage values. Improvements in embedded precision capacitors are needed.

SUMMARY

In a described example; a method for forming a capacitor includes: forming a capacitor first plate over a non-conductive substrate; flowing ammonia and nitrogen gas into a plasma-enhanced chemical vapor deposition (PECVD) chamber containing the non-conductive substrate; stabilizing a pressure and a temperature in the PECVD chamber; turning on radio frequency high frequency (HF-RF) power to the PECVD chamber; pretreating the capacitor first plate for at least 60 seconds; depositing a capacitor dielectric on the capacitor first plate; and depositing a capacitor second plate on the capacitor dielectric.

DETAILED DESCRIPTION

Corresponding numerals and symbols in the different figures generally refer to corresponding parts unless otherwise indicated. The figures are not necessarily drawn to scale.

The term "RF-HF" is used herein as an abbreviation for "radio frequency high frequency". An RF-HF signal is applied in a plasma enhanced chemical vapor deposition process at a frequency of between 10-20 MHz, and is often applied at a frequency of 13.56 MHz, a frequency that is available for instrumentation use without interfering with other radio frequency signals. The term "RF-LF" is used herein as an abbreviation for "radio frequency low frequency". An RF-LF signal is sometimes applied during dielectric depositions in processes using plasma enhanced chemical vapor deposition in the frequency range of 0-500 kHz.

Precision capacitors may be formed as standalone capacitors on or formed over a non-conducting substrate or may be formed as embedded capacitors in an integrated circuit.

Precision capacitors embedded in integrated circuits are implemented primarily at two different stages in an integrated circuit flow: 1) Before depositing a pre-metal dielectric (PMD) that underlies a first level of conductive interconnect material and 2) within the interconnect layers formed above a layer of interconnect material. Precision capacitors formed before PMD deposition are typically formed on underlying silicided polysilicon such as cobalt silicide ($CoSi_2$), titanium silicide ($TiSi_2$), molybdenum silicide, nickel silicide ($NiSi_2$), or nickel platinum silicide ($Ni(Pt)Si_2$). The first capacitor plate of a precision capacitor formed above an interconnect layer can be a layer of interconnect material or can be a layer of tantalum nitride, titanium nitride, and titanium tungsten deposited on a layer of inter-metal dielectric (IMD) between interconnect layers that is used to electrical insulate conductive interconnect layers.

Figure 1:
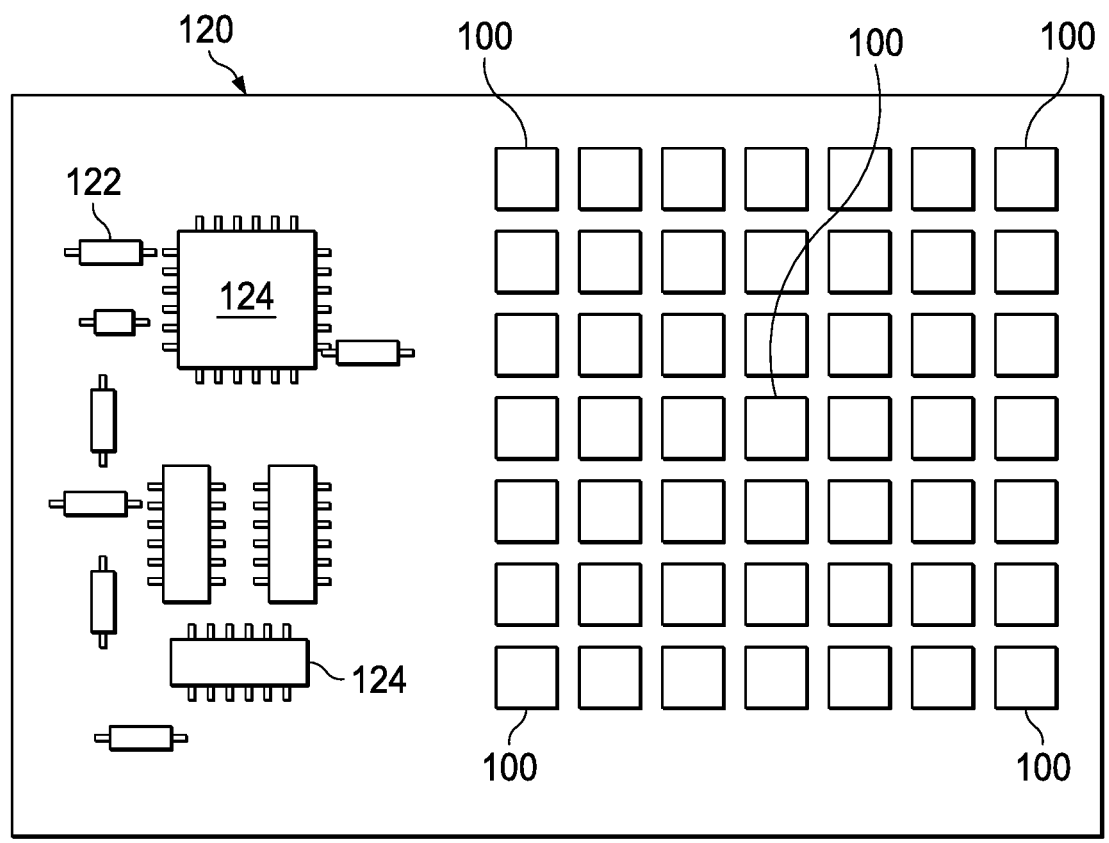
FIG. 1 is a plan view of an integrated circuit with an embedded high precision analog to digital capacitor array.

Analog to digital (A/D) integrated circuits (ICs) use high precision capacitors to accurately measure the electrical charge in an analog voltage signal and to convert it to a digital voltage value. FIG. 1 illustrates in a plan view an A/D converter (ADC) IC. The ADC IC 120 has peripheral circuity including transistors 124 and resistors 122 and an array of high precision capacitors 100. When an analog voltage signal is applied by the peripheral circuitry to the array of high precision capacitors 100, depending upon the magnitude of the analog voltage signal, a different number of the individual high precision capacitors 100 in the array become fully charged. The number of high precision capacitors 100 that become fully charged is proportional to a digital voltage value.

The precision (number of bits) in the converted digital voltage value is determined by the precision with which the high precision capacitors measure the electrical charge of the analog voltage signal. A nonlinear capacitance response to the voltage applied to the capacitor plates limits the precision of A/D conversion.

The voltage dependent capacitance C(V) of a capacitor is given by Equation 1:

$$C(V)=C_O(\alpha V^2+\beta V+1) \quad (1)$$

where: $C_o$ is the capacitance coefficient in units of $fF/\mu m^2$ at zero volts, $\alpha$ is the capacitance quadratic voltage coefficient (CQVC) in units of $ppm/V^2$, and $\beta$ is the capacitance linear voltage coefficient (CLVC) in units of ppm/V.

The magnitudes of $\alpha$ and $\beta$ are a function of the capacitor dielectric and can vary from a few parts per million (ppm) to thousands of ppm. Capacitors having voltage coefficients $\alpha$ and $\beta$ with relatively smaller values have reduced nonlinearity and the smaller voltage coefficient values enable conversion of an analog voltage signal to a digital voltage value with higher precision, or to more accurately measure the capacitance on a standalone precision capacitor.

When a metallic capacitor bottom plate is exposed to air or ambient atmosphere, oxygen and moisture from the atmosphere reacts with the silicide or metallic surface to form a thin layer of poor quality oxide dielectric. This poor-quality dielectric increases the nonlinearity of the capacitor. Sputter etching can be used to remove this poor-quality dielectric prior to deposition of the capacitor dielectric. In the arrangements, a preferred method to remove the poor-quality dielectric prior to forming the capacitor dielectric is to replace sputter etching with an ammonia ($NH_3$) gas plasma pretreatment.

Figure 2:
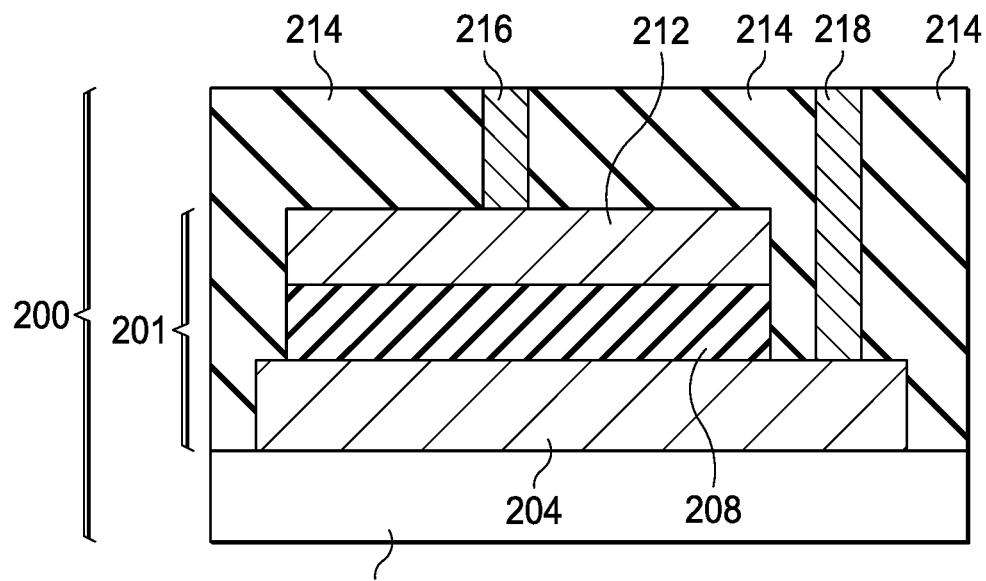
FIG. 2 is a cross section of an embedded capacitor.

FIG. 2 is a cross section of a capacitor. In FIG. 2 similar reference labels are used for similar elements shown in FIG. 1, for clarity. For example, capacitor 200 in FIG. 2 corresponds to capacitor 100 in FIG. 1. As oriented in FIG. 2, the high precision capacitor dielectric stack 201 is comprised of a capacitor dielectric 208 sandwiched between a capacitor second plate 212 and a capacitor first plate 204. The capacitor first plate 204 is deposited before the capacitor dielectric 208 and the capacitor second plate 212 is deposited after the capacitor dielectric 208. The capacitor dielectric 208 can be a dielectric such as silicon dioxide (referred to as "oxide", $SiO_2$, or simply O), silicon nitride (referred to as "nitride", $Si_3N_4$, SiN, or simply N), silicon oxynitride, or a dielectric stack of O and N layers. The first and second capacitor plates, 204 and 212, are of conductive materials, such as: doped polysilicon; a silicide such as titanium silicide, cobalt silicide, nickel silicide, molybdenum silicide, and platinum silicide; or a metallic material such as aluminum or aluminum alloy, copper or copper alloy, tungsten, titanium-tungsten, tantalum nitride, and titanium nitride.

The high precision capacitor 200 is built over a non-conductive substrate 202 and covered with a dielectric 214 such as silicon dioxide, silicon nitride, silicon oxynitride, or polyimide. The non-conductive substrate 202 can be an insulator, can be a dielectric layer overlying active devices in an integrated circuit, or can be an isolation area such as shallow trench isolation (STI) in an integrated circuit. The substrate 202 can also be a layer of inter-metal dielectric (IMD) overlying an interconnect layer above a semiconductor substrate of an integrated circuit. Electrical contact is made to the capacitor first plate 204 with a first metal filled contact or via 218. Electrical contact is made to the capacitor second plate 212 with a second metal filled contact or via 216.

High precision capacitors in A/D converters are used to accurately measure the amount of charge in an analog signal and convert it to a digital value. The precision of the digital value (number of bits) is determined by how accurately the precision capacitor measures the charge in the analog signal. One difficulty is that capacitance changes with the applied voltage in a nonlinear fashion as given by Equation (1). A capacitor dielectric stack with a small capacitance quadratic voltage coefficient $\alpha$ and a small capacitance linear voltage coefficient $\beta$ enables the conversion of an analog voltage signal to a digital voltage value with higher precision.

Silicon nitride (N) and silicon dioxide (O) dielectric stacks such as NON and ONO are preferably used in alternating layers. Alternating layers are used because the sign of the quadratic capacitance coefficient $\alpha$ for O is opposite to that for N. Taking advantage of the opposite sign of $\alpha$ for N and O, the thicknesses of the N and O layers in the NON and ONO dielectric stacks are adjusted to yield a dielectric stack with a low capacitance quadratic voltage coefficient $\alpha$. In high precision capacitors with an ONO dielectric stack, the thickness of the O layers is about half the thickness of the N layer for a low capacitance quadratic voltage coefficient. In high precision capacitors with a NON dielectric stack the thickness of the O layer is about equal to the thickness of the N layers.

In the arrangements, the capacitance quadratic voltage coefficient of a NON or ONO stack can be additionally reduced by reducing the hydrogen content of the N film in the capacitor dielectric stack as is described in the co-owned, co-pending contemporaneously filed U.S. patent application Ser. No. 15/902,764, which is incorporated herein by reference.

ONO with reduced hydrogen N film is the preferred capacitor dielectric stack in high precision capacitors of the arrangements and is used herein below for illustration. In the preferred ONO film, the hydrogen content of the N film is less than 25% and preferably less than 20%. Although an ONO dielectric stack is used for illustration, capacitors with other dielectric stacks such as NON, ON, and NO and other dielectrics such as O, N, oxynitride can be used.

In the arrangements, the capacitance quadratic voltage coefficient $\alpha$ is additionally reduced by pretreating the capacitor first plate with an ammonia plasma prior to the deposition of the capacitor dielectric.

Figure 3:
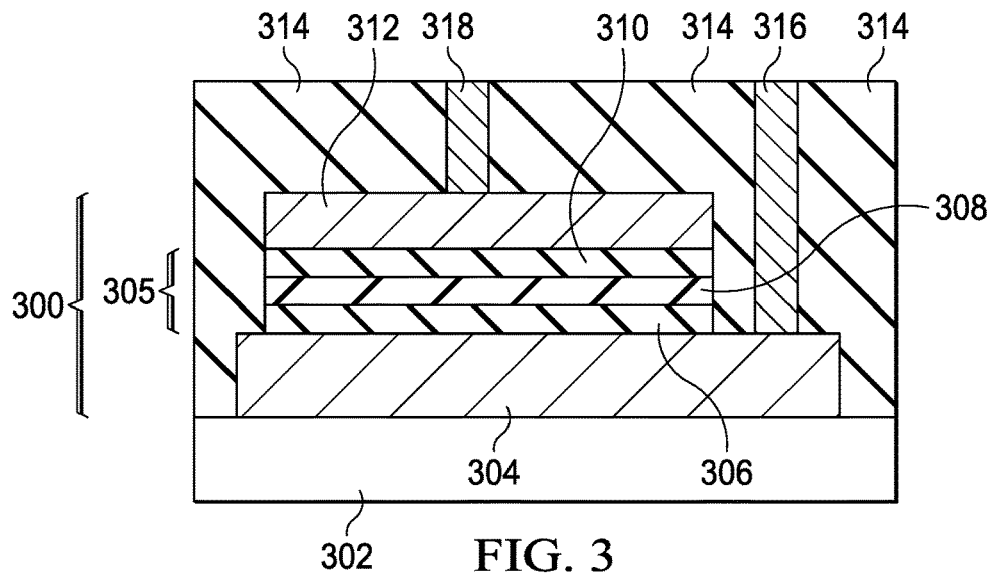
FIG. 3 is a cross section of an integrated circuit with an embedded capacitor comprised of a dielectric stack between a first and a second capacitor plate.

A capacitor 300 with an ONO dielectric stack 305 is illustrated in a cross section in FIG. 3. In FIG. 3 similar reference labels are used for similar elements as shown in FIG. 1, for clarity. For example, substrate 302 in FIG. 3 corresponds to substrate 102 in FIG. 1. As oriented in FIG. 3, the capacitor 300 is a structure including dielectric stack 305 sandwiched between a capacitor first plate 304 and a capacitor second plate 312. The dielectric stack 305 is a N layer 308 sandwiched between a first O layer 306 and a second O layer 310. The capacitor first plate 304 is deposited on a substrate or insulating layer 302. The ONO dielectric stack 305 is deposited on the capacitor first plate 304. The capacitor second plate 312 is deposited on the ONO dielectric stack 305. The capacitor 300 is covered with an insulating 314 layer such as a premetal dielectric (PMD) or intermetal dielectric (IMD). Electrical contact is made to the capacitor first plate 304 with a first metal filled contact or via 316. Electrical contact is made to the capacitor second plate 312 with a second metal filled contact or via 318.

In the arrangements, an ammonia ($NH_3$) pretreatment of the capacitor first plate 304 prior to the dielectric stack 305 deposition, additionally reduces the magnitude of the linear, $\beta$, and quadratic, $\alpha$, capacitance voltage coefficients in Equation 1. This increases the precision of the capacitor which enables the conversion of an analog voltage signal to a digital voltage value with higher accuracy.

As shown in Table 1, the capacitance linear voltage coefficient, $\beta$, for capacitors with a capacitor bottom plate sputter etch pretreatment is −7.28 and −9.52 ppm/V, whereas $\beta$ for the capacitor with a capacitor bottom plate $NH_3$ pretreatment is −2.38 ppm/V. Also shown in Table 1, the capacitance quadratic voltage coefficient, $\alpha$, for the capacitors with capacitor bottom plate sputter etch pretreatment is −0.75 and −0.59 ppm/$V^2$, whereas $\alpha$ for the capacitor with capacitor bottom plate $NH_3$ pretreatment is −0.43 ppm/$V^2$. The $NH_3$ pretreatment in the arrangements significantly reduces the absolute value of both the linear $\beta$ and the nonlinear $\alpha$ capacitance voltage coefficients enabling higher precision during A/D conversion.

|  | Units | Low Hydrogen with $NH_3$ bottom capacitor plate pretreatment | Low Hydrogen with sputter etch bottom capacitor plate pretreatment | Low Hydrogen with sputter etch bottom capacitor plate pretreatment |
| --- | --- | --- | --- | --- |
| Film capacitance per unit area | fF/$\mu m^2$ | ONO 1.01 | ONO 1.03 | ONO 1.03 |
| Breakdown | Volts | 49.7 | 49.3 | 49.3 |

-continued

|  | Units | Low Hydrogen with NH₃ bottom capacitor plate pretreatment | Low Hydrogen with sputter etch bottom capacitor plate pretreatment | Low Hydrogen with sputter etch bottom capacitor plate pretreatment |
|---|---|---|---|---|
| Target Thickness | nm | 11/22/11 | 11/22/11 | 11/22/11 |
| CLVC (β) | ppm/V | −2.38 | −7.28 | −9.52 |
| CQVC (α) | ppm/V² | −0.43 | −0.75 | −0.59 |

In the arrangements, the capacitance linear voltage coefficient of an ONO dielectric stack with a silicon nitride layer having less than 25 atomic percent hydrogen can be reduced to an absolute value of 3.5 ppm/V or less with the $NH_3$ plasma pretreatment of the first capacitor plate. The capacitance quadratic voltage coefficient of an ONO dielectric stack with a silicon nitride layer having less than 25 atomic percent hydrogen can be reduced to an absolute value of 0.5 ppm/V² or less with an $NH_3$ plasma pretreatment of the first capacitor plate.

TABLE 2

Stacked Capacitor Dielectric Films

|  | Pressure (Torr) | Temp °C. | RF-HF Watts | Time sec. | NH₃ sccm | N₂ sccm |
|---|---|---|---|---|---|---|
| NH3 Pretreatment | 3.5 | 400 | 400 | 180 | 3000 | 1000 |

TABLE 3

Stacked Capacitor Dielectric Films

| SiN film | Pressure (Torr) | Temp °C. | RF-HF Watts | RF-LF Watts | SiH₄ sccm | NH₃ sccm | N₂ sccm |
|---|---|---|---|---|---|---|---|
| Low Hydrogen | 2 | 400 | 50 | 100 | 25 | 300 | 4500 |

The $NH_3$ pretreatment conditions for the results given in Table 1 are listed in Table 2. The $NH_3$ pretreatment can be performed in a plasma-enhanced chemical vapor deposition (PECVD) reactor with radio frequency high frequency (RF-HF) power in the range of about 400 Watts, temperature in the range of about 300° C. to 500° C., pressure in the range of about 2 Torr to about 5 Torr, with a $NH_3$ flow rate between about 1000 sccm and 5000 sccm (standard cubic centimeter per minute flow rate units), and with a $N_2$ flow rate between about 0 sccm and 3000 sccm.

In an example arrangement, the $NH_3$ pretreatment for the dielectrics in Table 1 is performed in an example PECVD tool with RF-HF of 13.56 MHz, a temperature of 400° C., a pressure of 3.5 Torr, a flow rate of $H_2$ of 1000 sccm, and a flow rate of $NH_3$ of 3000 sccm. In alternative arrangements, the above PECVD $NH_3$ pretreatment recipe can be adapted to other PECVD deposition tools to achieve a similar reduction in the absolute values of α and β.

The deposition conditions for the low hydrogen N layer in the ONO dielectric stack are given in Table 3.

Figure 4:
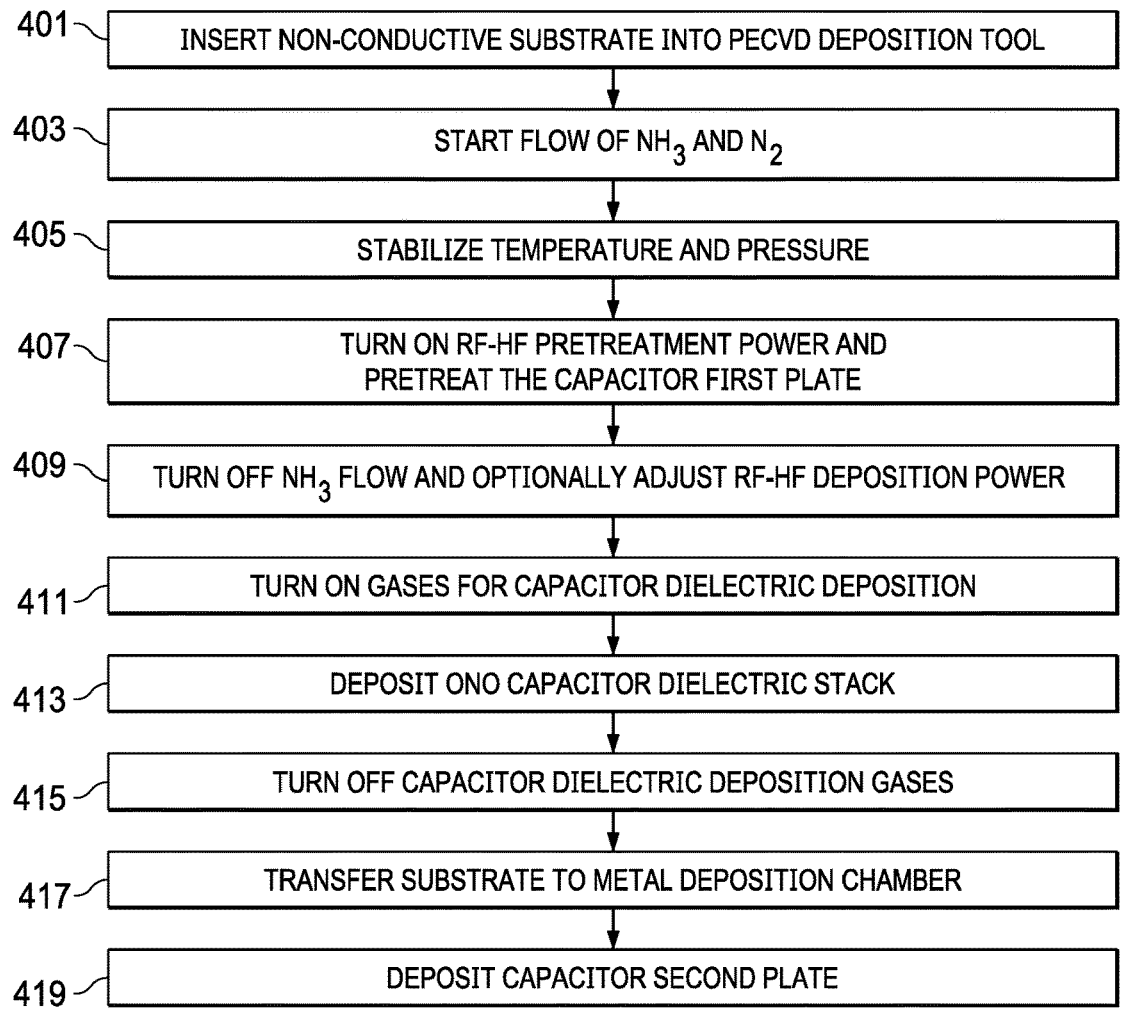
FIG. 4 is a flow diagram of a method for forming an integrated circuit with an embedded capacitor containing a dielectric stack.

FIG. 4 is a flow diagram illustrating the major steps in a process for forming in a precision capacitor with improved nonlinearity. The flow diagram is for a capacitor using an ONO dielectric stack but can readily be adapted for forming a NON dielectric stacks, ON or NO dielectric stacks or other dielectrics such as O, N, and oxynitride.

In step 401 a substrate with a capacitor first plate is loaded into the PECVD deposition chamber. The capacitor first plate can be formed on a non-conducting substrate. Examples of the non-conducting substrate include an insulating layer overlying an integrated circuit, isolation dielectric such as shallow trench isolation (STI), or IMD on a layer of interconnect above an integrated circuit. The capacitor first plate can be a conductive material such as doped single crystal silicon, doped polysilicon, a metal silicide, or a metal nitride such as a tantalum nitride (TaN). In the arrangement from which the data in Table 1 is taken, the capacitor first plate is cobalt suicide formed on doped polysilicon.

In step 403 the pretreatment gas, $NH_3$ and $N_2$ flows are started in the deposition chamber.

In step 405 the pretreatment temperature and pretreatment pressure are stabilized. In a described example deposition, the pretreatment temperature is stabilized at about 400° C. and the pretreatment pressure is stabilized at about 2 Torr.

In step 407 the RF-HF power is turned on and plasma $NH_3$ pretreatment of the capacitor first plate is performed. In a described example the RF-HF power is 400 W at 13.56 MHz. The $NH_3$ pretreatment is performed for 60 seconds or more. In an example the $NH_3$ pretreatment is performed for 180 seconds.

In step 409 the $NH_3$ flow is turned off and the RF-HF power level is adjusted to the power level required for dielectric deposition. If the high precision capacitor dielectric being deposited is N or NON instead of ONO, the $NH_3$ flow is not turned off. In an example depositing an ONO dielectric stack, the $NH_3$ flow is turned off. To minimize particle formation, it is advantageous to deposit the dielectric stack layers using the same pressure, temperature and RF-HF power as is used for the $NH_3$ pretreatment. However, in alternative arrangements one or more of the parameters (pressure, temperature, RF-HF power) can be varied.

In step 411, $SiH_4$ gas flow plus $O_2$ gas flows are turned on to initiate $SiO_2$ deposition for the first O layer in the ONO dielectric stack.

In step 413, the N layer and the second O layer are deposited in sequence to form the ONO dielectric stack.

In step 415, after the ONO dielectric stack is deposited, the deposition gas flows are turned off to terminate dielectric stack deposition.

In step 417 the substrate is removed from the PECVD deposition chamber and transferred into a metal deposition chamber.

In step 419 a metallic second capacitor plate is deposited on the dielectric stack.

A capacitor second plate pattern is formed on the capacitor second plate and the capacitor second plate and the dielectric stack can be etched using the second plate pattern. The pattern and etch process forms the dielectric stack 305 and capacitor second plate 312 shown in FIG. 3. A capacitor first plate pattern can then be formed and the capacitor first plate etched to form the capacitor first plate 304 shown in FIG. 3. An insulating layer 314 such as PMD or IMD can then be deposited to cover and electrically isolate the high precision capacitor 300. Additional processing appropriate to the integrated circuit can then be performed.

In the arrangements, $NH_3$ pretreatment of the capacitor first plate prior to capacitor dielectric deposition reduces the absolute value of the linear (β) and quadratic (α) capacitance voltage coefficients. This improves the ability of the precision capacitor to accurately measure an analog voltage signal and is especially beneficial for analog to digital circuits in integrated circuits.

Modifications are possible in the described arrangements, and other alternative arrangements are possible within the scope of the claims.

What is claimed is:

1. A method for forming a capacitor, comprising:
    forming a capacitor first plate over a non-conductive substrate;
    flowing ammonia and nitrogen gas into a plasma-enhanced chemical vapor deposition (PECVD) chamber containing the non-conductive substrate;
    stabilizing a pressure and a temperature in the PECVD chamber;
    turning on radio frequency high frequency (RF-HF) power to the PECVD chamber;
    pretreating the capacitor first plate for at least 60 seconds;
    depositing a capacitor dielectric on the capacitor first plate; and
    depositing a capacitor second plate on the capacitor dielectric.

2. The method of claim 1 wherein a flow rate of the ammonia gas is in a range of about 1000 sccm to about 5000 sccm and a non-zero flow rate of the nitrogen gas is up to about 3000 sccm.

3. The method of claim 1 wherein the temperature is about 400° C. and the pressure is about 3.5 Torr.

4. The method of claim 1 wherein the pretreatment is performed for 180 seconds, with an RF-HF power of 400 W, a temperature of 400° C., a pressure of 3.5 Torr, an ammonia gas flow rate of 3000 sccm and a nitrogen gas flow rate of 1000 sccm.

5. A method for forming an integrated circuit with an embedded capacitor, comprising:
    placing a semiconductor substrate with a capacitor first plate in a plasma-enhanced chemical vapor deposition (PECVD) chamber;
    flowing ammonia gas at a flow rate between 1000 sccm and 5000 sccm into the PECVD chamber;
    flowing nitrogen gas at a flow rate between 0 sccm and 3000 sccm into the PECVD chamber;
    stabilizing pressure between 2 Torr and 5 Torr in the PECVD chamber;
    stabilizing temperature between 300 degrees Celsius and 500 degrees Celsius in the PECVD chamber;
    turning on radio frequency high frequency (RF-HF) power to the PECVD chamber and setting a power level between 200 Watts and 600 Watts;
    pretreating the capacitor first plate for about 60 seconds or longer;
    depositing a dielectric stack with silicon dioxide and silicon nitride layers and with less than 25 atomic percent hydrogen in the silicon nitride layer on the capacitor first plate; and
    depositing a capacitor second plate material on the dielectric stack.

6. The method of claim 5 wherein a flow rate of the ammonia gas is about 3000 sccm, a flow rate of the nitrogen gas is about 1000 sccm, the temperature is about 400 C, the pressure is about 3.5 Torr, and the RF-HF power is 400 W at 13.56 MHz.

7. The method of claim 5, wherein the dielectric stack is a silicon dioxide (O)/silicon nitride (N)/silicon dioxide (O) (ONO) stack wherein the O layers are about half a thickness of the N layer.

8. The method of claim 5, wherein the integrated circuit is an analog to digital integrated circuit.

9. A method for forming an integrated circuit having a capacitor, comprising:
    forming a capacitor first plate over a substrate, wherein the capacitor first plate is one selected from the group consisting essentially of: CoSi2, NiSi2, NiPtSi2, TiSi2, MoSi2, TaN, TiN, and TiW;
    flowing ammonia and nitrogen gas into a plasma-enhanced chemical vapor deposition (PECVD) chamber containing the substrate;
    stabilizing a pressure and a temperature in the PECVD chamber;
    turning on radio frequency high frequency (RF-HF) power to the PECVD chamber;
    pretreating the capacitor first plate for at least 60 seconds;
    depositing a capacitor dielectric on the capacitor first plate, the capacitor dielectric including silicon dioxide (O)/silicon nitride (N)/silicon dioxide (O) (ONO) dielectric stack wherein the silicon nitride has an atomic hydrogen % less than about 25 atomic percent; and
    depositing a capacitor second plate on the capacitor dielectric.

10. The method of claim 9 wherein a flow rate of the ammonia gas is about 3000 sccm, a flow rate of the nitrogen gas is about 1000 sccm, the temperature is about 400 C, the pressure is about 3.5 Torr, and the RF-HF power is 400 W at 13.56 MHz.

11. The method of claim 9, wherein the 0 layers of the ONO dielectric stack are about half a thickness of the N layer.

12. The method of claim 9, wherein the integrated circuit is an analog to digital integrated circuit.

* * * * *